(12) United States Patent
Wu et al.

(10) Patent No.: US 8,099,659 B2
(45) Date of Patent: Jan. 17, 2012

(54) LOGIC TESTER AND METHOD FOR SIMULTANEOUSLY MEASURING DELAY PERIODS OF MULTIPLE TESTED DEVICES

(75) Inventors: Yung-Yu Wu, Yilan County (TW); Huei-Huang Chen, Taipei County (TW)

(73) Assignee: Princeton Technology Corporation, HsinTien, Taipei County (TW)

( * ) Notice: Subject to any disclaimer, the term of this patent is extended or adjusted under 35 U.S.C. 154(b) by 83 days.

(21) Appl. No.: 12/638,368

(22) Filed: Dec. 15, 2009

(65) Prior Publication Data

US 2010/0153800 A1  Jun. 17, 2010

(30) Foreign Application Priority Data

Dec. 16, 2008 (TW) .............................. 97148892 A

(51) Int. Cl.
*G06F 11/00* (2006.01)
(52) U.S. Cl. ........................ 714/815; 714/700
(58) Field of Classification Search .................. None
See application file for complete search history.

(56) References Cited

U.S. PATENT DOCUMENTS

| | | | | | |
|---|---|---|---|---|---|
| 5,384,541 | A | * | 1/1995 | Chu et al. ...................... | 324/617 |
| 5,467,044 | A | * | 11/1995 | Ashe et al. .................... | 327/333 |
| 5,923,676 | A | * | 7/1999 | Sunter et al. .................. | 714/733 |
| 6,075,418 | A | * | 6/2000 | Kingsley et al. ............... | 331/57 |
| 6,246,737 | B1 | * | 6/2001 | Kuglin ......................... | 375/371 |
| 6,313,676 | B1 | * | 11/2001 | Abe et al. ...................... | 327/158 |
| 6,586,962 | B2 | * | 7/2003 | Sakurai et al. .................. | 326/16 |
| 6,693,449 | B1 | * | 2/2004 | Gorgen ...................... | 324/750.3 |
| 6,735,684 | B1 | * | 5/2004 | Shigematsu et al. ........... | 712/10 |
| 6,766,484 | B2 | * | 7/2004 | Motoyama .................... | 714/718 |
| 6,944,780 | B1 | * | 9/2005 | Kranzen et al. ............... | 713/300 |
| 6,996,032 | B2 | * | 2/2006 | Ganry ......................... | 368/118 |

OTHER PUBLICATIONS

Hornak, Tomas; , "Circuit-Delay Test Instrument," Instrumentation and Measurement, IEEE Transactions on , vol. IM-20, No. 4, pp. 238-242, Nov. 1971.*

* cited by examiner

*Primary Examiner* — Jeffrey A Gaffin
*Assistant Examiner* — Steve Nguyen
(74) *Attorney, Agent, or Firm* — Muncy, Geissler, Olds & Lowe, PLLC

(57) ABSTRACT

The invention provides a logic tester. In one embodiment, the logic tester is coupled to a plurality of tested devices, and includes a function generator and a pattern comparator. The function generator generates an initial code sequence as an input signal of the tested devices to fix output signals of the tested devices to a first value, and then generates a functional code sequence as the input signal of the tested devices to trigger the output signals of the tested devices to change from the first value to a second value. The pattern comparator converts the output signals of the tested devices to a plurality of bitstreams after the functional code sequence is generated, calculates numbers of bits corresponding to the first value in the bitstreams, estimates delay periods of the tested devices according to the numbers of bits, and outputs the delay periods of the tested devices.

17 Claims, 5 Drawing Sheets

LOGIC TESTER AND METHOD FOR SIMULTANEOUSLY MEASURING DELAY PERIODS OF MULTIPLE TESTED DEVICES

CROSS REFERENCE TO RELATED APPLICATIONS

This Application claims priority of Taiwan Patent Application No. TW097148892, filed on Dec. 16, 2008, the entirety of which is incorporated by reference herein.

BACKGROUND OF THE INVENTION

1. Field of the Invention

The invention relates to testing of devices, and more particularly to measuring delay periods of tested devices.

2. Description of the Related Art

When an electronic device receives an input signal, the electronic device requires a time period to generate an output signal in response to the input signal. The time period is referred to as a delay period of the electronic device. A delay period of an electronic device reflects performance of the electronic device. Generally, a high-performance electronic device has a short delay period, and a low-performance electronic device has a long delay period.

When a system comprises a plurality of cascaded electronic devices, the total delay period of the system is a sum of the delay periods of all the cascaded electronic devices. Thus, to assure acceptable performance of the system, normally, the total delay period of the system is limited to be shorter than a threshold level. A delay period of an electronic device is therefore an important factor in evaluating performance of a system comprising the electronic device.

A logic tester is conventionally used to measure a delay period of an electronic device. Referring to FIG. 1, a block diagram of a testing system 100 comprising a conventional logic tester 102 is shown. In one embodiment, the logic tester 102 comprises a function generator 104 and a time counter 106. In addition to the logic tester 102, the system 100 further comprises a plurality of switches 122~12N and 132~13N, and a plurality of tested devices 112, 114, ..., 11N. An output terminal $S_I$ of the logic tester 102 is coupled to input terminals $S_{I1}$, $S_{I2}$, ..., $S_{IN}$ of the tested devices 112, 114, ..., 11N via the switches 122~12N. Similarly, an input terminal $S_O$ of the logic tester 102 is coupled to output terminals $S_{O1}$, $S_{O2}$, ..., $S_{ON}$ of the tested devices 112, 114, ..., 11N via the switches 132~13N. Because the logic tester 102 cannot simultaneously measure delay periods of two tested devices, the logic tester must respectively measures the delay periods of the tested devices 112~11N one by one.

Referring to FIG. 2, a flowchart of a method 200 for measuring delay periods of tested devices is shown. The logic tester 102 operates according to the method 200 to measure delay periods of the tested devices 112~11N. First, an operator of the testing system 100 selects a target tested device from the tested devices 112, 114, ..., 11N (step 202). Assume that the target tested device is the tested device 112. The operator therefore switches on the switches 122 and 132 to couple the tested device 112 to the logic tester 102, and switches off the other switches 124~12N and 134~13N. The logic tester 102 then generates an initial code sequence as an input signal of the target tested device 112 (step 204). In one embodiment, the function generator 104 generates the initial code sequence. When the target tested device 112 receives the initial code sequence, the target tested device 112 fixes an output signal $S_{O1}$ thereof to a first value.

The logic tester 102 then generates a functional code sequence as an input signal of the target tested device 112 (step 206). In one embodiment, the function generator 104 generates the functional code sequence. After the functional code sequence is generated, the output signal $S_{O1}$ of the target tested device 112 changes from the first value to a second value. When the functional code sequence is generated (step 208), the logic tester 102 monitors the output signal $S_{O1}$ of the target tested device 112 (step 210), and a time counter 106 of the logic tester 102 starts to accumulate a delay period of the target tested device 112 (step 212).

When the logic tester 102 detects that the value of the output signal $S_{O1}$ of the target tested device 112 changes from the first value to a second value (step 214), the time counter 106 stops accumulation of the delay period, and outputs the delay period (step 216). Testing of the target tested device 112 is therefore completed. If there are still tested devices which have not been tested (step 218), the operator selects a new target tested device from the tested devices 114~11N (step 202), switches on the switches corresponding to the new target tested device, and switches off the switches corresponding to other tested devices. The logic tester 102 then executes steps 204~216 again to measure the delay period of the new tested device. The testing process is continued until all of the tested devices 112~11N in the testing system 100 have been tested.

Because the logic tester 102 can only measure a delay period of a tested device one at a time, when there are many tested devices in the testing system 100, the logic tester 102 has to repeat the steps 204~218 for many times, requiring much time to be spent and effort of the operator of the testing system 100. In addition, when the target tested device is changed, the operator has to decouple the old target tested device from the logic tester 102 and couple the new target tested device to the logic tester 102. The conventional logic tester 102 shown in FIG. 1 is therefore inconvenient for the operator of the testing system 100. A logic tester capable of simultaneously measuring delay periods of multiple tested devices is therefore required.

SUMMARY OF THE INVENTION

The invention provides a logic tester. In one embodiment, the logic tester is coupled to a plurality of tested devices, and comprises a function generator and a pattern comparator. The function generator generates an initial code sequence as an input signal of the tested devices to fix output signals of the tested devices to a first value, and then generates a functional code sequence as the input signal of the tested devices to trigger the output signals of the tested devices to change from the first value to a second value. The pattern comparator converts the output signals of the tested devices to a plurality of bitstreams after the functional code sequence is generated, calculates numbers of bits corresponding to the first value in the bitstreams, estimates delay periods of the tested devices according to the numbers of bits, and outputs the delay periods of the tested devices.

The invention also provides a method for simultaneously measuring delay periods of a plurality of tested devices. First, an initial code sequence is generated as an input signal of the tested devices to fix output signals of the tested devices to a first value. A functional code sequence is then generated as the input signal of the tested devices to trigger the output signals of the tested devices to change from the first value to a second value. After the functional code sequence is generated, the output signals of the tested devices are converted to a plurality of bitstreams. Numbers of bits corresponding to the first value in the bitstreams are then calculated. Finally, the delay periods of the tested devices are estimated according to the number of bits.

The invention further provides a logic tester. In one embodiment, the logic tester is coupled to a plurality of tested devices. The logic tester converts output signals of the tested devices to a plurality of bitstreams according to a clock signal, calculates of bits corresponding to a first value in the bitstreams, estimates delay periods of the tested devices according to the number of bits, and outputs the delay periods of the tested devices.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
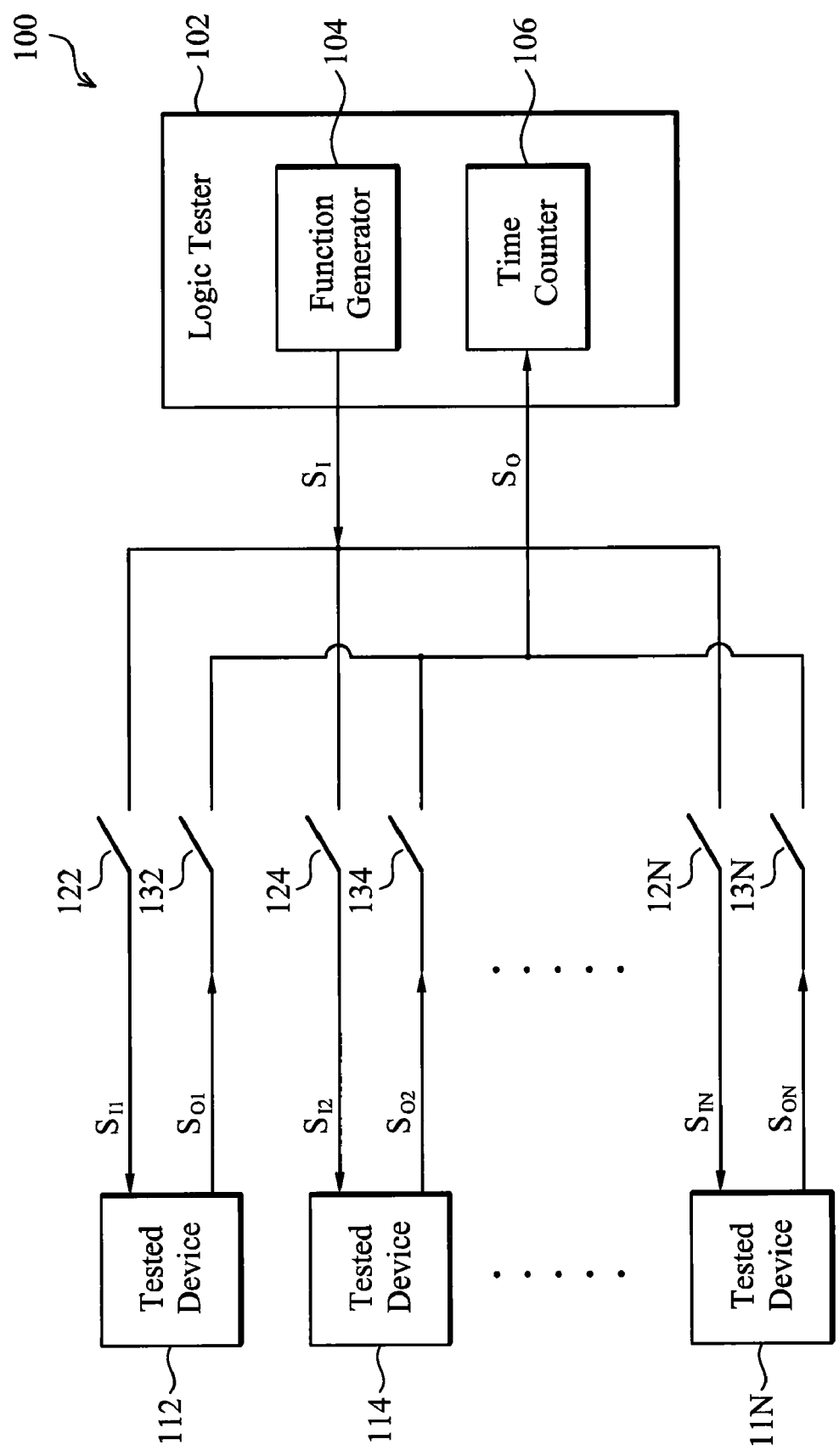
FIG. 1 is a block diagram of a testing system comprising a conventional logic tester.
Figure 2:
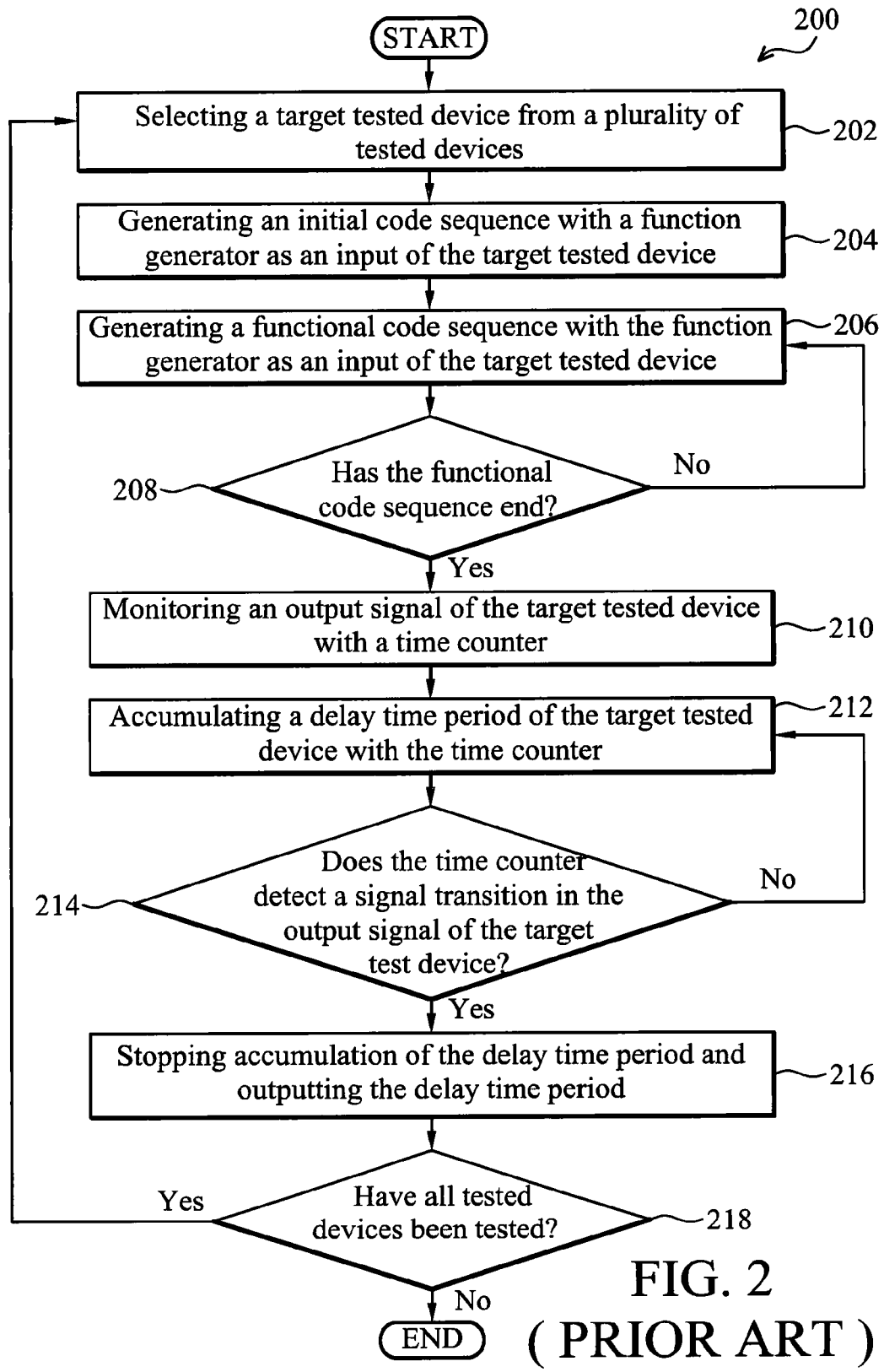
FIG. 2 is a flowchart of a conventional method for measuring delay periods of tested devices.
Figure 3:
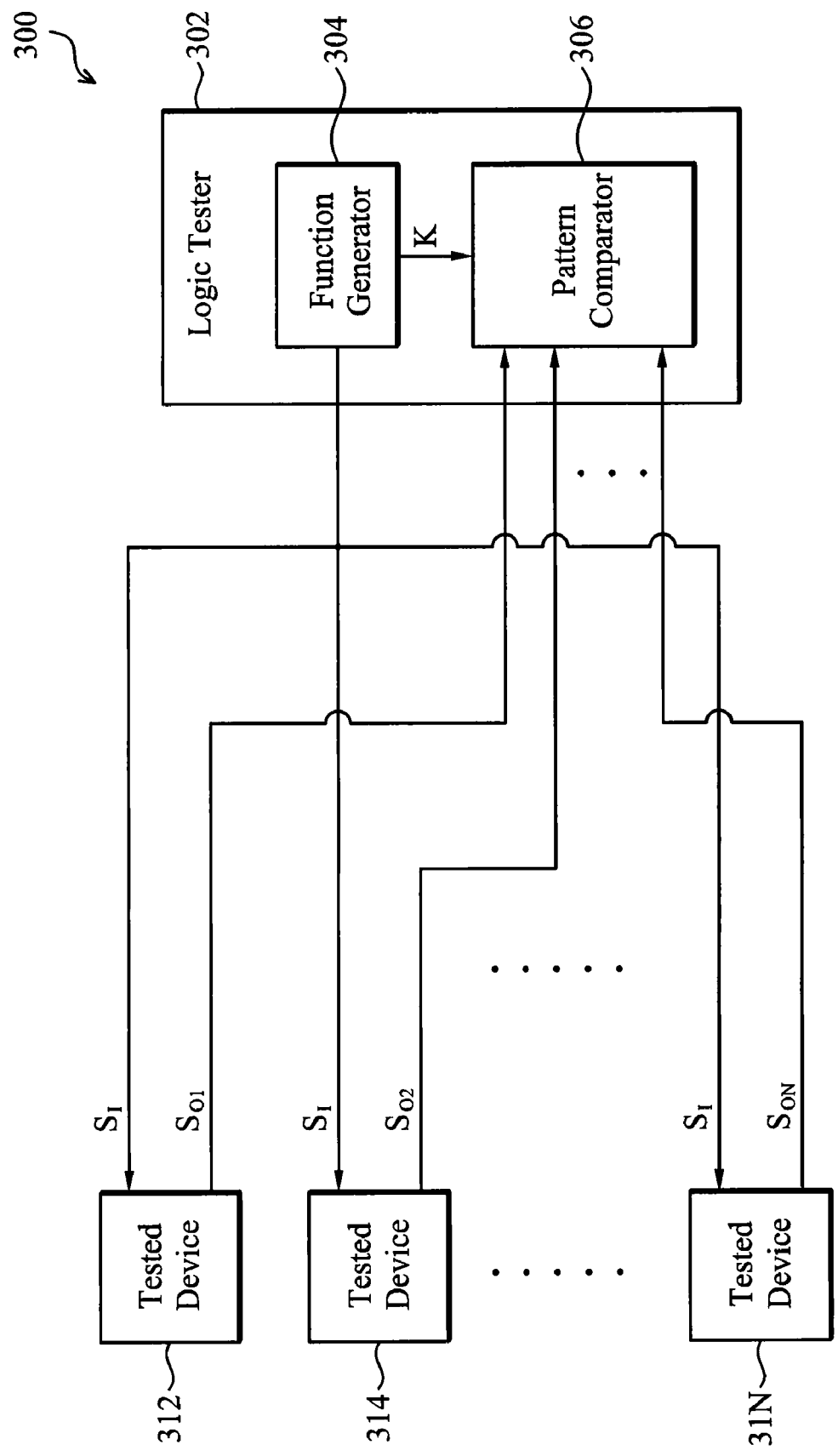
FIG. 3 is a block diagram of a testing system for simultaneously measuring delay periods of multiple tested devices according to the invention.

Referring to FIG. 3, a block diagram of a testing system 300 for simultaneously measuring delay periods of multiple tested devices according to the invention is shown. The testing system 300 comprises a logic tester 302 and a plurality of tested device 312, 314, ..., and 31N. In one embodiment, the logic tester 302 comprises a function generator 304 and a pattern comparator 306. An output terminal of the function generator 304 is coupled to input terminals of the tested devices 312, 314, ..., and 31N. The pattern comparator 306 has multiple input terminals respectively coupled to the output terminals of the tested devices 312, 314, ..., and 31N.

Figure 4:
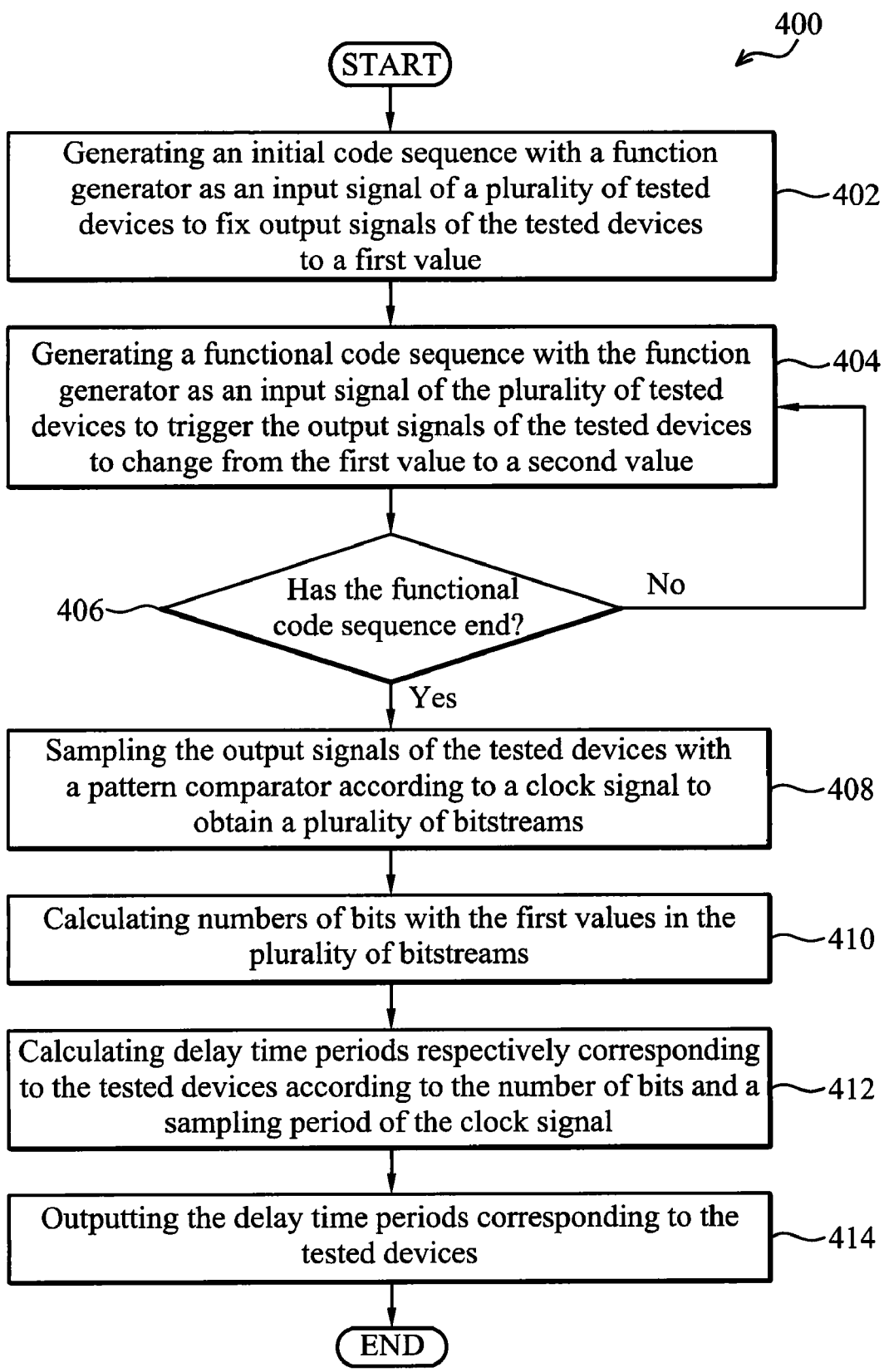
FIG. 4 is a flowchart of a method for simultaneously measuring delay periods of multiple tested devices according to the invention.
Figure 5:
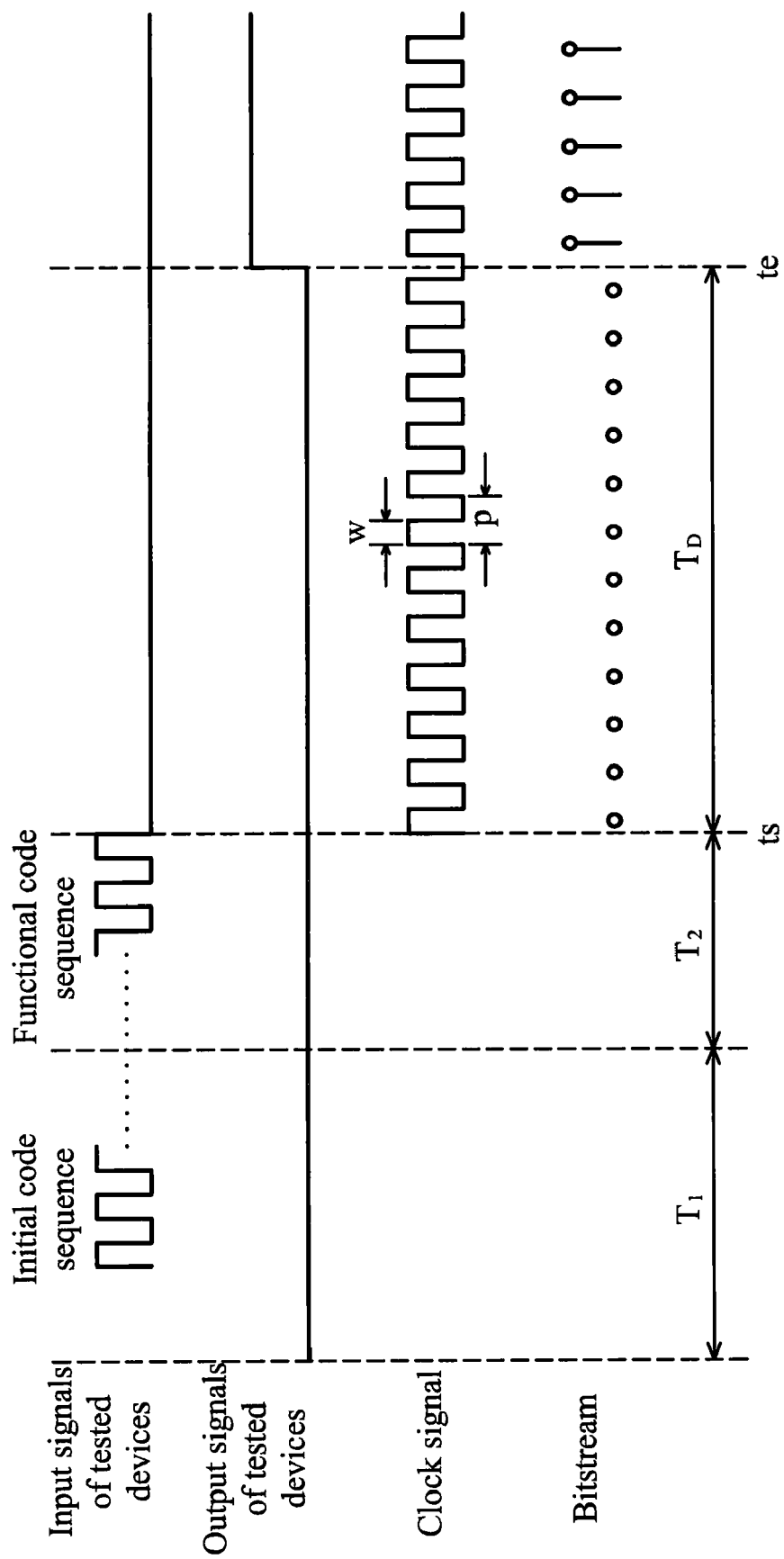
FIG. 5 is a schematic diagram of signals corresponding to the logic tester of FIG. 3 according to the invention.

Referring to FIG. 4, a flowchart of a method 400 for simultaneously measuring delay periods of multiple tested devices according to the invention is shown. The logic tester 302 operates according to the method 400 to measure delay periods of the tested devices 312, 314, ..., and 31N. First, the function generator 304 of the logic tester 302 generates an initial code sequence as an input signal $S_I$ of the tested devices 312, 314, ..., and 31N, thus fixing output signals $S_{O1}$, $S_{O2}$, ..., and $S_{ON}$ of the tested devices 312, 314, ..., and 31N to a first value (step 402). Referring to FIG. 5, a schematic diagram of signals corresponding to the logic tester 302 according to the invention is shown. During a time period T1, the function generator 304 of the logic tester 302 generates an initial code sequence, and an output signal of a tested device is fixed to a low level, as shown in FIG. 5.

The function generator 304 of the logic tester 302 then generates a functional code sequence as an input signal $S_I$ of the tested devices 312, 314, ..., 31N to trigger the output signals $S_{O1}$, $S_{O2}$, ..., and $S_{ON}$ of the tested devices 312, 314, ..., and 31N to change from the first value to a second value (step 404). Referring to FIG. 5, the function generator 304 of the logic tester 302 generates a functional code sequence during a period T2. Ideally, the output signals $S_{O1}$, $S_{O2}$, ..., and $S_{ON}$ of the tested devices 312, 314, ..., and 31N should change from the first value (at a low level) to the second value (at a high level) right away when the functional code sequence is generated at time ts. The output signals $S_{O1}$, $S_{O2}$, ..., and $S_{ON}$ of the tested devices 312, 314, ..., and 31N, however, change from the first value (at a low level) to the second value (at a high level) at time te which is later than the time ts. The period $T_D$ between the time te and the time ts is referred to as the delay period of a tested device, and the logic tester 302 must precisely measure the delay period $T_D$.

The pattern comparator 306 of the logic tester 302 then monitors the output signals $S_{O1}$, $S_{O2}$, ..., and $S_{ON}$ of the tested devices 312, 314, ..., and 31N to measure delay periods $T_D$ of the tested devices 312, 314, ..., and 31N. When the functional code sequence ends, the function generator 306 generates a trigger signal K to trigger the pattern comparator 306. The pattern comparator 306 then simultaneously samples the output signals $S_{O1}$, $S_{O2}$, ..., and $S_{ON}$ of the tested devices 312, 314, ..., and 31N according to a clock signal to obtain a plurality of bitstreams (step 408). The clock signal and a bitstream obtained by sampling an output signal of a tested device are shown in FIG. 5. In one embodiment, the pattern comparator 306 compares the output signals $S_{O1}$, $S_{O2}$, ..., and $S_{ON}$ of the tested devices 312, 314, ..., and 31N with a threshold value to generate the bitstreams, wherein the threshold value lies between the first value and the second value.

The pattern comparator 306 then calculates numbers of bits corresponding to the first value in the bitstreams (step 410). As shown in FIG. 5, the output signal of the tested device has the first value during the period $T_D$, and changes to the second value at time te. Because the bitstream has only one sample in each sampling period of the clock signal, the number of sample bits in the bitstream is in proportion to a time period containing the sample bits. The delay period TD is therefore also in proportion to the of bits corresponding to the first value in the bitstream. The pattern comparator 306 then respectively multiplies the numbers of bits corresponding to the first value by a sampling period p of the clock signal to obtain the delay periods of the tested devices 312, 314, ..., 31N (step 412). Finally, the logic tester 302 outputs the delay periods of the tested devices 312, 314, ..., 31N (step 414).

The clock signal in FIG. 5 is applied as a reference for the pattern comparator 306 to sample the output signals $S_{O1}$, $S_{O2}$, ..., and $S_{ON}$ of the tested devices 312, 314, ..., and 31N. The pattern comparator 306 generates different data streams according to different clock signals. In one embodiment, the sampling period, the duty cycle, and the voltage level of the clock signals are adjustable. The sampling period of the clock signal determines the number of sampled bits and precision of the calculated delay period. When the sampling period of the clock signal is shorter, the pattern comparator 306 obtains more sampled bits in the bitstreams, and calculates the delay periods with higher precision. In addition, the duty cycle of the clock signal is defined by a ratio between the strobe width w and a sampling period p, as shown in FIG. 5. In one embodiment, the duty cycle of the clock signal is greater than 90%.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A logic tester, comprising:
 a function generator generating an initial code sequence as an input signal of a plurality of tested devices for fixing output signals of the tested devices to a first value, and a functional code sequence as the input signal of the tested devices for changing the output signals of the tested devices from the first value to a second value; and
 a pattern comparator, sampling the output signals with a clock signal to convert the output signals of the tested devices into a plurality of bitstreams after the functional code sequence is generated, calculating numbers of bits corresponding to the first value in the bitstreams, estimating delay periods of the tested devices according to the numbers of bits, and outputting the delay periods of the tested devices, wherein the duty cycle of the clock signal is greater than 90%.

2. The logic tester as claimed in claim 1, wherein after the functional code sequence is generated, the function generator generates a trigger signal to the pattern comparator to trigger conversion of the output signals to the bitstreams, thus synchronizing an end of the functional code sequence with the start of the conversion of the output signals.

3. The logic tester as claimed in claim 1, wherein the pattern comparator calculates the delay periods of the tested devices according to the numbers of the bits and a sampling period of the clock signal.

4. The logic tester as claimed in claim 3, wherein the pattern comparator multiplies the numbers of the bits by the sampling period of the clock signal to obtain the delay periods of the tested devices.

5. The logic tester as claimed in claim 1, wherein the pattern comparator compares the output signals with a threshold level value to generate the bitstreams, wherein the threshold level value lies between the first value and the second value.

6. The logic tester as claimed in claim 1, wherein the frequency of the clock signal is adjustable.

7. A method for simultaneously measuring delay periods of a plurality of tested devices, comprising:
 generating an initial code sequence as an input signal of the tested devices for fixing output signals of the tested devices to a first value;
 generating a functional code sequence as the input signal of the tested devices to change the output signals of the tested devices from the first value to a second value;
 sampling the output signals with a clock signal to convert the output signals of the tested devices into a plurality of bitstreams after the functional code sequence is generated, wherein the duty cycle of the clock signal is greater than 90%;
 calculating numbers of bits corresponding to the first value in the bitstreams; and
 estimating the delay periods of the tested devices according to the numbers of bits.

8. The method as claimed in claim 7, wherein the method further comprises generating a trigger signal to the pattern comparator to trigger conversion of the output signals to the bitstreams after the functional code sequence is generated, thereby synchronizing an end of the functional code sequence with the start of the conversion of the output signals.

9. The method as claimed in claim 7, wherein conversion of the output signals comprises multiplying the numbers of the bits by the sampling period of the clock signal to obtain the delay periods of the tested devices.

10. The method as claimed in claim 7, wherein conversion of the output signals comprises comparing the output signals with a threshold level value to generate the bitstreams, wherein the threshold level value lies between the first value and the second value.

11. The method as claimed in claim 7, wherein the frequency of the clock signal is adjustable.

12. A logic tester coupled to a plurality of tested devices, comprising:
 means for converting output signals of the tested devices to a plurality of bitstreams by sampling the output signals with a clock signal, wherein the duty cycle of the clock signal is greater than 90%;
 means for calculating numbers of bits corresponding to a first value in the bitstreams;
 means for estimating delay periods of the tested devices according to the numbers of bits; and
 means for outputting the delay periods of the tested devices.

13. The logic tester as claimed in claim 12, wherein the logic tester generates an initial code sequence as an input signal of the tested devices to fix the output signals of the tested devices to the first value, and generates a functional code sequence as the input signal of the tested devices to trigger the output signals of the tested devices to change from the first value to a second value.

14. The logic tester as claimed in claim 13, wherein after the functional code sequence is generated, the logic tester starts to convert the output signals to the bitstreams.

15. The logic tester as claimed in claim 12, wherein the logic tester multiplies the numbers of the bits by the sampling period of the clock signal to obtain the delay periods of the tested devices.

16. The logic tester as claimed in claim 13, wherein the logic tester compares the output signals with a threshold level value to generate the bitstreams, wherein the threshold level value lies between the first value and the second value.

17. The logic tester as claimed in claim 12, wherein the frequency of the clock signal is adjustable.

* * * * *